(12) United States Patent
Aliane et al.

(10) Patent No.: US 11,127,875 B2
(45) Date of Patent: Sep. 21, 2021

(54) METHOD FOR MANUFACTURING AT LEAST ONE PASSIVATED PLANAR PHOTODIODE WITH REDUCED DARK CURRENT

(71) Applicant: Commissariat A L'Energie Atomique et aux Energies Alternatives, Paris (FR)

(72) Inventors: Abdelkader Aliane, Grenoble (FR); Jean-Louis Ouvrier-Buffet, Grenoble (FR); Luc Andre, Grenoble (FR); Hacile Kaya, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/687,801

(22) Filed: Nov. 19, 2019

(65) Prior Publication Data
US 2020/0168758 A1    May 28, 2020

(30) Foreign Application Priority Data
Nov. 23, 2018   (FR) ..................... 18 71729

(51) Int. Cl.
*H01L 31/102*   (2006.01)
*H01L 31/18*    (2006.01)
(Continued)

(52) U.S. Cl.
CPC .... *H01L 31/1868* (2013.01); *H01L 31/02161* (2013.01); *H01L 31/0312* (2013.01);
(Continued)

(58) Field of Classification Search
CPC ........... H01L 31/1868; H01L 31/02161; H01L 31/0312; H01L 31/105; H01L 31/1812; H01L 31/1864
(Continued)

(56) References Cited

U.S. PATENT DOCUMENTS

2005/0101073 A1   5/2005   Bae et al.
2009/0008739 A1   1/2009   Bae et al.
(Continued)

FOREIGN PATENT DOCUMENTS

EP   3 151 290 A1   4/2017

OTHER PUBLICATIONS

French Preliminary Search Report dated Sep. 4, 2019 in French Application 18 71729 filed on Nov. 23, 2018 (with English Translation of Categories of Cited Documents & Written Opinion).
(Continued)

*Primary Examiner* — Calvin Y Choi
(74) *Attorney, Agent, or Firm* — Oblon, McClelland, Maier & Neustadt, L.L.P.

(57) ABSTRACT

The invention relates to a method for manufacturing at least one passivated planar photodiode 1, comprising the following steps:
  producing a semiconductor detection portion 10;
  depositing a dielectric passivation layer 20;
  producing a peripheral portion 21 made from a doped semiconductor material;
  diffusion-annealing the doping elements from the peripheral portion 21 into the semiconductor detection portion 10, forming a doped peripheral region 14;
  producing a doped upper region 11, surrounded by the doped peripheral region 14.

14 Claims, 6 Drawing Sheets

(51) Int. Cl.
*H01L 31/0216* (2014.01)
*H01L 31/0312* (2006.01)
*H01L 31/105* (2006.01)

(52) U.S. Cl.
CPC ........ *H01L 31/105* (2013.01); *H01L 31/1812* (2013.01); *H01L 31/1864* (2013.01)

(58) Field of Classification Search
USPC ........................................................ 257/458
See application file for complete search history.

(56) References Cited

U.S. PATENT DOCUMENTS

2010/0301442 A1* 12/2010 Iwai ..................... H01L 31/105
257/437
2013/0084660 A1* 4/2013 Lu ..................... H01L 27/14689
438/14
2017/0092801 A1 3/2017 Moussy et al.

OTHER PUBLICATIONS

Sood, A, et al., "Characterization of SiGe-Detector Arrays for Visible-NIR Imaging Sensor Applications", Proc. of SPIE vol. 8012, 2011, 10 pages.

* cited by examiner

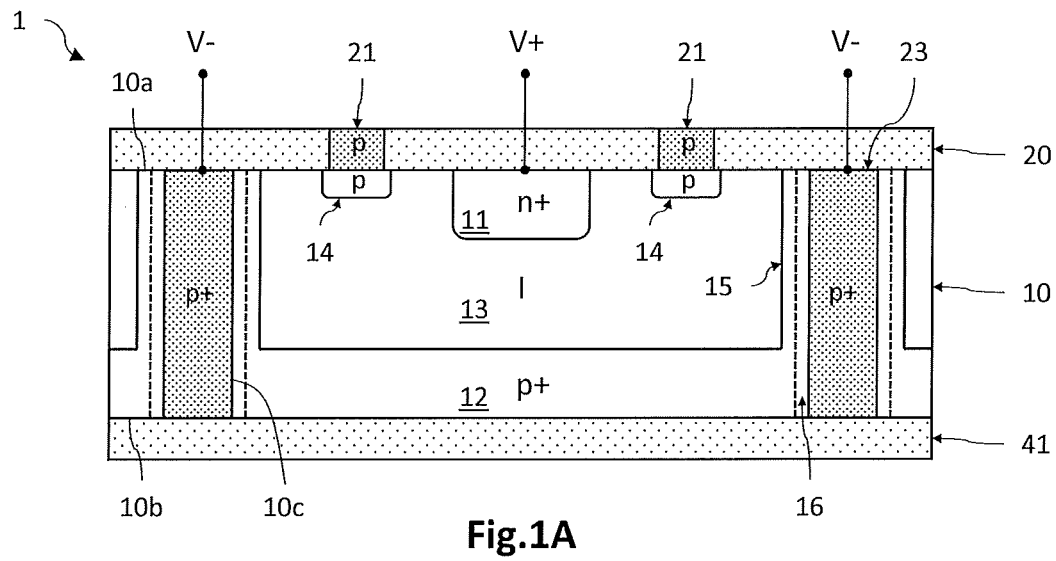
Fig.1A
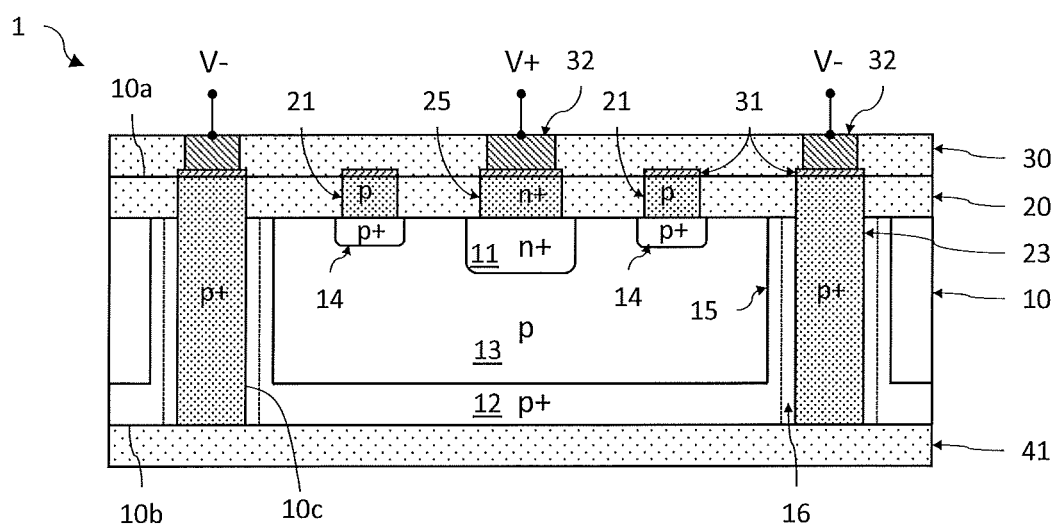
Fig.1B
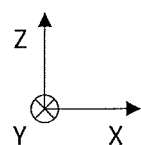

METHOD FOR MANUFACTURING AT LEAST ONE PASSIVATED PLANAR PHOTODIODE WITH REDUCED DARK CURRENT

TECHNICAL FIELD

The field of the invention is that of optoelectronic devices having one or more passivated planar photodiodes. The invention is applied in particular in the field of detecting light radiation belonging for example to the near infrared, the photodiode or photodiodes then being able to be based on germanium.

PRIOR ART

Optoelectronic photodetection devices may have an array of passivated planar photodiodes. The photodiodes then extend in one and the same main plane, between first and second opposing faces that are parallel to one another. They then each have a first doped region, for example n-doped and flush with the first face, and a second doped region, for example p-doped and flush with the second face. The two doped regions are then separated from one another by an intrinsic intermediate region or very slightly doped, for example p-doped, region. A passivation layer covers the first face in order to limit the contribution of dark current to the electric current measured by each photodiode.

However, it appears that the presence of the passivation layer may still contribute to generating a non-negligible dark current. Thus, the article by Sood et al. *Characterization of SiGe-Detector Arrays for Visible-NIR Imaging Sensor Applications*, Proc. of SPIE VOL. 8012, 801240, 2011, describes a method for manufacturing a passivated planar photodiode in order to limit dark current. Dark current is linked to the presence of a depleted zone situated in the semiconductor material of the photodiode, at the interface with the passivation layer. The manufacturing method then comprises a step of annealing the photodiode under $N_2H_2$, making it possible to transform this depleted zone into a hole accumulation zone. It appears that this step then makes it possible to reduce the intensity of the dark current.

However, this annealing step, which is intended to change the depleted zone into an accumulation zone, may degrade the performance of the photodiode, in particular due to an undesired modification of the dimensions of the first n-doped region, in particular when the diffusion length of the n-type doping elements is significant. Moreover, the presence and the characteristics of the depleted zone may be linked to the technique used to deposit the passivation layer as well as to the operating conditions. As a result, the annealing in question may then not make it possible to reproducibly obtain the desired accumulation zone and thus the desired reduction of the dark current.

DISCLOSURE OF THE INVENTION

The aim of the invention is to at least partly rectify the drawbacks of the prior art, and more particularly to propose a method for manufacturing one or more passivated planar photodiodes in order to achieve a low dark current while at the same time preserving the properties of the photodiode or photodiodes, and in particular the dimensions of the doped first region or regions.

To this end, the subject of the invention is a method for manufacturing at least one passivated planar photodiode, comprising the following steps:

i) producing what is called a semiconductor detection portion, having a first and a second face that are opposite one another and parallel to a main plane of the photodiode, and having:
what is called an intermediate region flush with the first face,
what is called a lower region doped with a second conductivity type and flush with the second face,
ii) depositing a passivation layer, made from a dielectric material, covering the first face, and forming, in the passivation layer, at least one through-aperture opening onto the first face and at least partially surrounding a central part of the semiconductor detection portion in the main plane;
iii) producing a lateral portion made from a semiconductor material doped with the second conductivity type and intended to be electrically biased, in contact with the lower region. The lateral portion may surround the semiconductor detection portion in the main plane.

According to the invention, the method comprises the following steps:
iv) producing at least one peripheral portion, made from a semiconductor material containing doping elements with the second conductivity type, and coming into contact with, or resting on and in contact with, the first face through the through-aperture;
v) annealing, ensuring diffusion of the doping elements from the peripheral portion to the semiconductor detection portion, thereby forming, in the semiconductor detection portion, a peripheral region doped with the second conductivity type, flush with the first face and surrounding the central part in the main plane, the peripheral region being intended to be situated between and at a non-zero distance from what is called an upper region and the lateral portion;
vi) producing, in the central part of the semiconductor detection portion, the upper region doped with a first conductivity type opposite the second type and intended to be electrically biased, flush with the first face and separated from the lower region by the intermediate region, and surrounded in the main plane by the peripheral region.

Certain preferred but nonlimiting aspects of this manufacturing method are as follows.

The method may comprise a step of producing, prior to the annealing step, a lateral portion made from a semiconductor material doped with the second conductivity type, in contact with and surrounding the semiconductor detection portion in the main plane, the annealing step furthermore ensuring diffusion of doping elements with the second conductivity type from the lateral portion to the semiconductor detection portion, thereby forming a lateral region doped with the second conductivity type in the semiconductor detection portion.

The semiconductor detection portion may be based on germanium, and the lateral portion may be based on silicon, the annealing step furthermore ensuring diffusion of the silicon from the lateral portion to the semiconductor detection portion, thereby forming a lateral zone based on silicon-germanium in the semiconductor detection portion.

The method may comprise the following steps:
producing a stack made from a semiconductor material of interest, formed of a lower sublayer doped with the second conductivity type and of an intermediate sublayer;

producing a trench extending through the stack of lower and intermediate sublayers, thereby defining the semiconductor detection portion of the photodiode;

simultaneously producing the lateral portion and the peripheral portion by depositing a semiconductor material doped with the second conductivity type in the through-aperture of the passivation layer and in the trench.

The method may comprise a step of producing at least one reflective portion, situated in contact with the peripheral portion on a face opposite the semiconductor detection portion, made from a material that is reflective with respect to the incident light radiation intended to be detected by the photodiode.

The reflective portion may be obtained by depositing a layer made from a metal material on the peripheral portion, this portion being based on silicon, followed by silicidation annealing, thereby forming a reflective portion made from the metal material thus silicided.

The step of producing the doped upper region may comprise the following sub-steps:

producing a central portion made from a semiconductor material doped with the first conductivity type, arranged in what is called a central through-aperture of the passivation layer situated in the central part, and in contact with the first face;

annealing, ensuring the diffusion of doping elements with the first conductivity type from the central portion to the semiconductor detection portion, thereby forming the upper region.

The step of producing the central portion may comprise the following sub-steps:

depositing a semiconductor material doped with the second conductivity type, identical to that of the peripheral portion, in the central through-aperture;

ion-implanting doping elements with the first conductivity type in the central portion.

The invention also relates to a passivated planar photodiode, having:

what is called a semiconductor detection portion, having a first and a second face that are opposite one another and parallel to a main plane of the photodiode, having:
an upper region doped with a first conductivity type and flush with the first face,
a lower region doped with a second conductivity type opposite the first type, and flush with the second face,
an intermediate region situated between the upper and lower regions and surrounding the upper region in the main plane, a passivation layer covering the first face, having through-apertures each filled with a peripheral portion, made from a semiconductor material containing doping elements with the second conductivity type, and resting on and in contact with the first face through the through-aperture;

a lateral portion made from a semiconductor material doped with the second conductivity type and intended to be electrically biased, in contact with the lower region and able to surround the semiconductor detection portion in the main plane the semiconductor detection portion having a peripheral region, doped with the second conductivity type, flush with the first face and surrounding the upper region in the main plane, and situated between and at a non-zero distance from the upper region and the lateral portion.

The photodiode may have a peripheral portion, made from a semiconductor material doped with the second conductivity type, situated in contact with the peripheral region through a through-aperture of the passivation layer.

The photodiode may have a central portion, made from a semiconductor material doped with the first conductivity type, situated in contact with the upper region through a through-aperture of the passivation layer.

The peripheral portion and the central portion may be coated with a reflective portion made from a silicided metal material.

The photodiode may have a lateral portion, doped with the second conductivity type, in contact with and surrounding the semiconductor detection portion in the main plane, and in which the semiconductor detection portion has a lateral region doped with the second conductivity type and in contact with the lateral portion.

The semiconductor detection portion may be based on germanium and the lateral portion may be based on silicon, the semiconductor detection portion then possibly having a lateral zone based on silicon-germanium and in contact with the lateral portion.

The invention also relates to an optoelectronic device having an array of photodiodes according to any one of the preceding features, in which the photodiodes are coplanar in the main plane.

BRIEF DESCRIPTION OF THE DRAWINGS

Other aspects, aims, advantages and features of the invention will become more clearly apparent upon reading the following detailed description of preferred embodiments thereof, which description is given by way of non-limiting example and with reference to the appended drawings, in which:

FIGS. 1A and 1B are sectional, schematic and partial views of a passivated planar photodiode according to two embodiments;

DETAILED DISCLOSURE OF PARTICULAR EMBODIMENTS

Figure 2A:
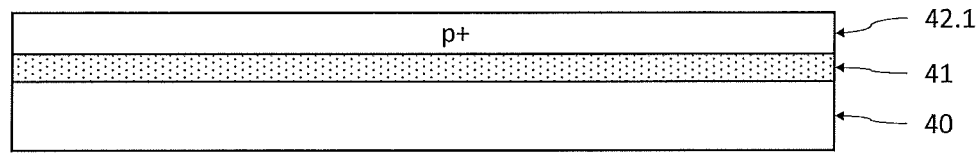
FIGS. 2A to 2L schematically and partially illustrate various steps of a method for manufacturing photodiodes according to one variant of the embodiment illustrated in FIG. 1B.
Figure 2B:
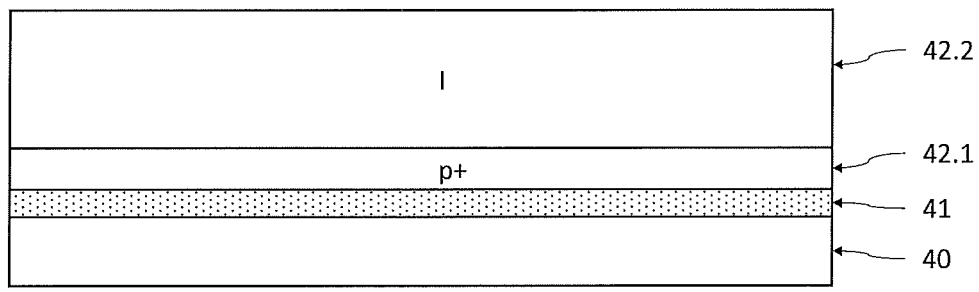
Figure 2C:
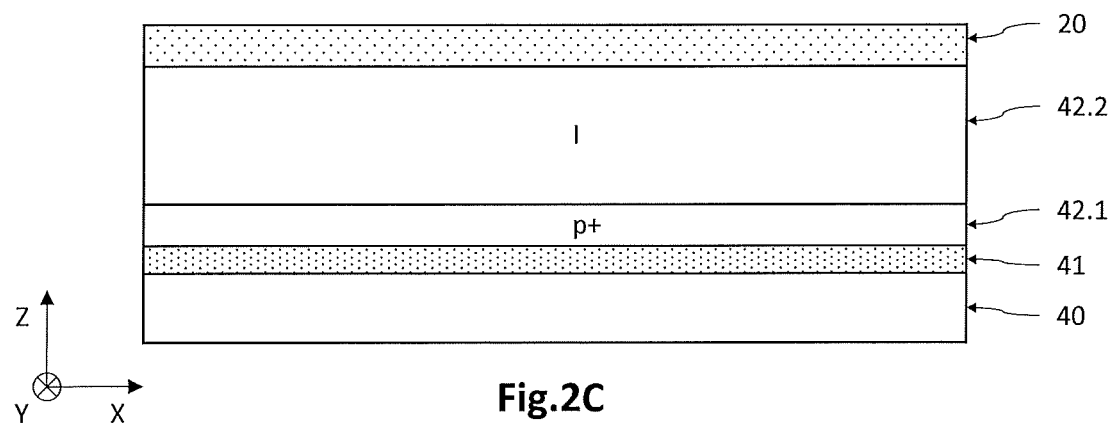
Figure 2D:
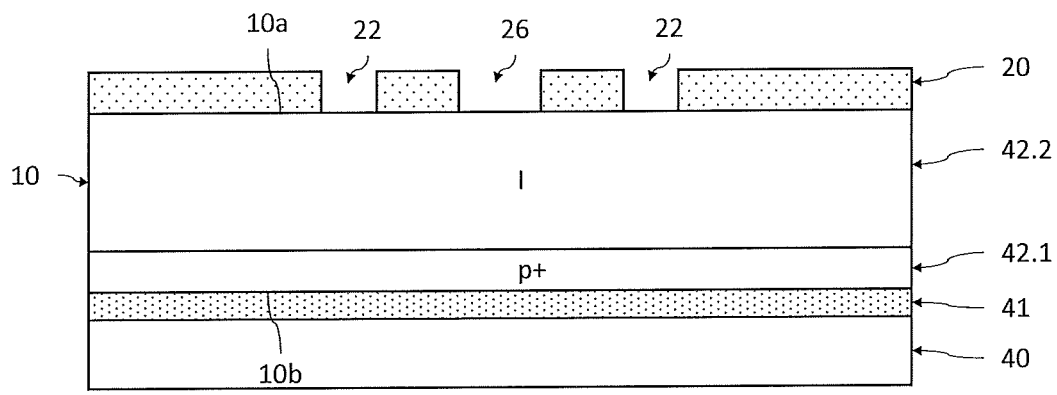
Figure 2E:
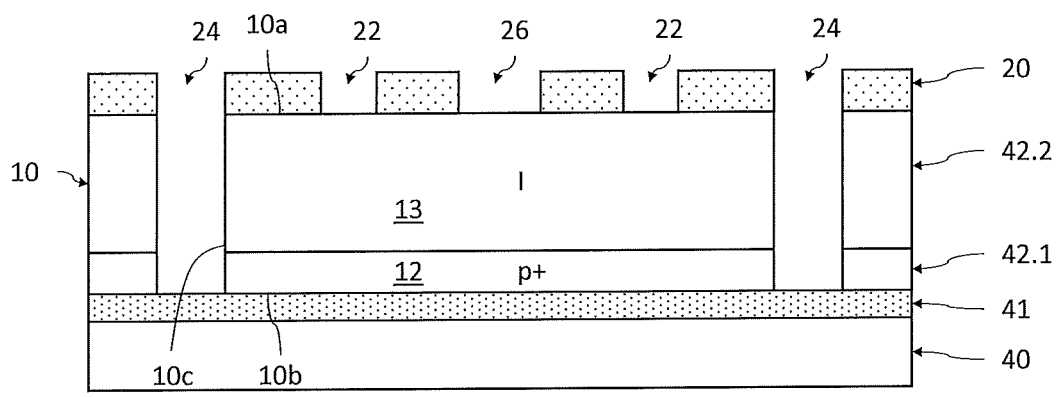
Figure 2F:
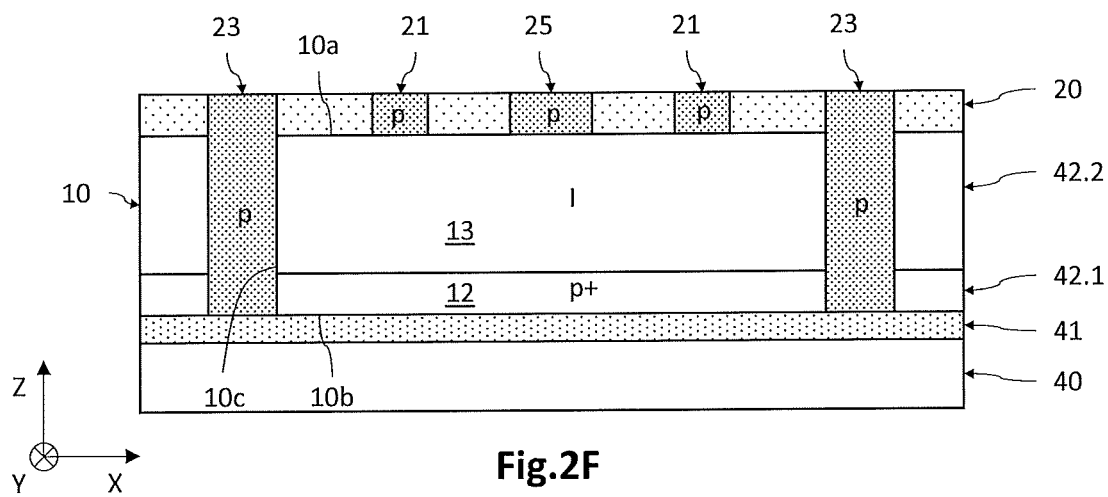
Figure 2G:
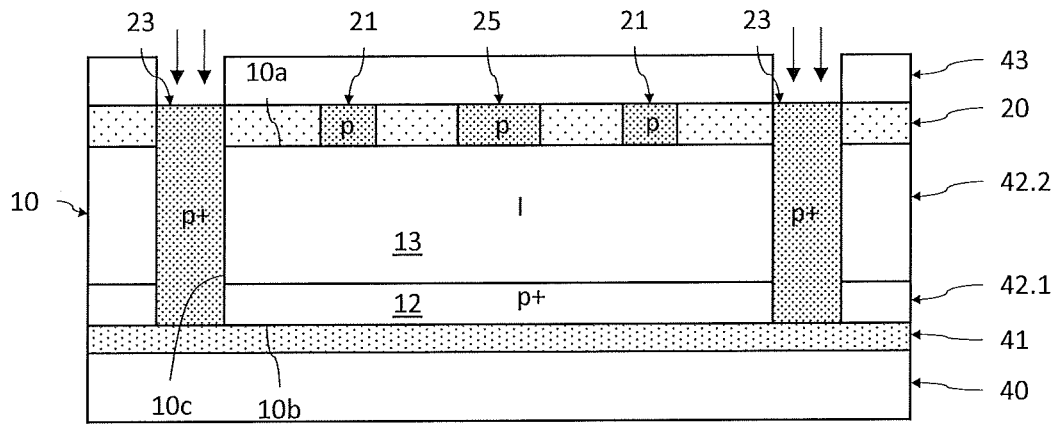
Figure 2H:
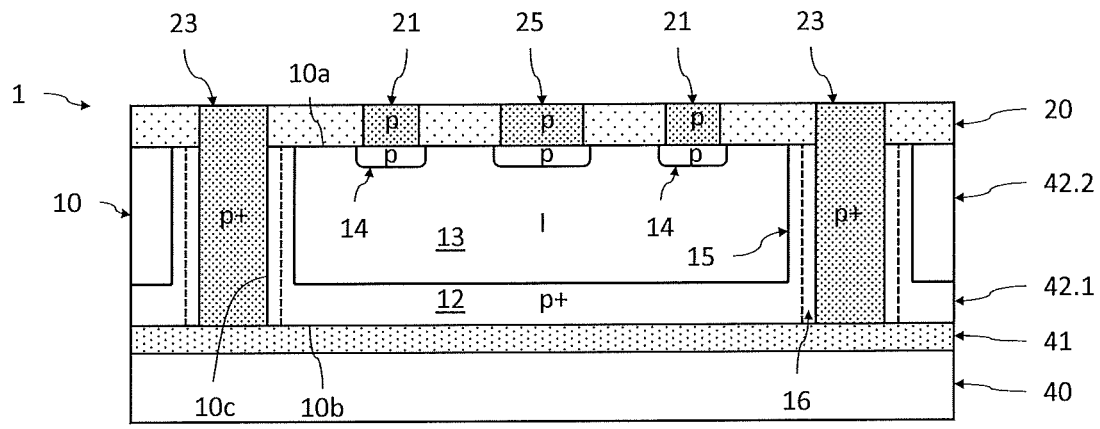
Figure 2I:
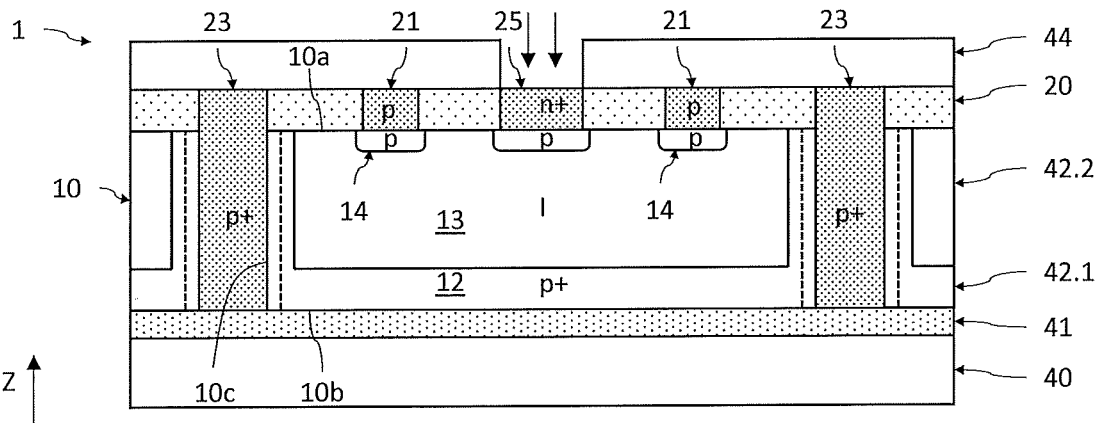
Figure 2J:
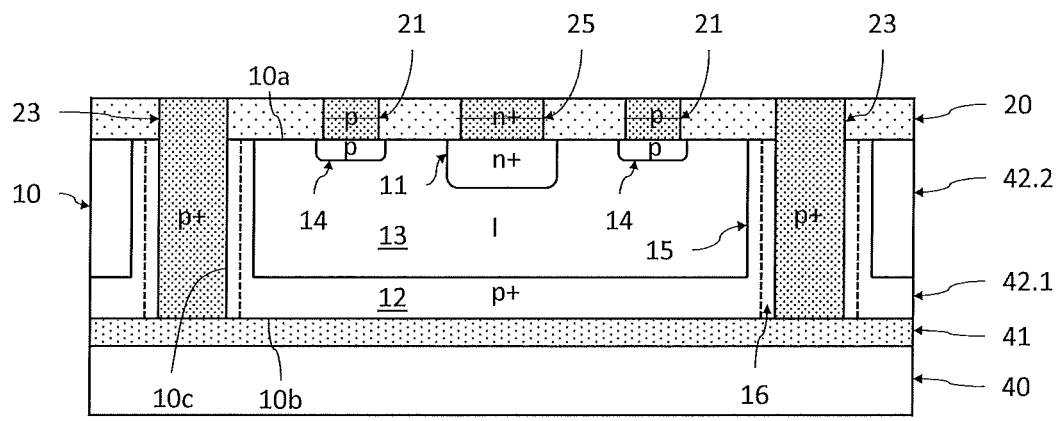
Figure 2K:
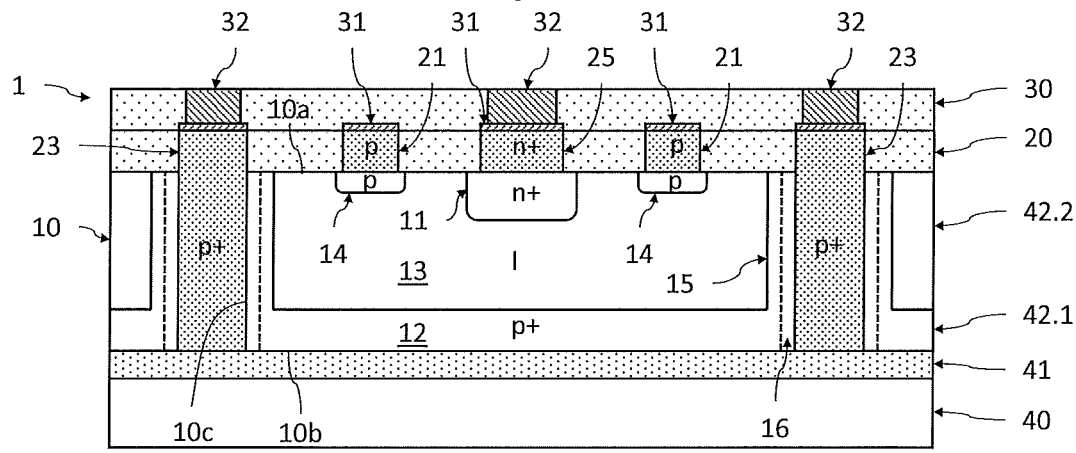
Figure 2L:
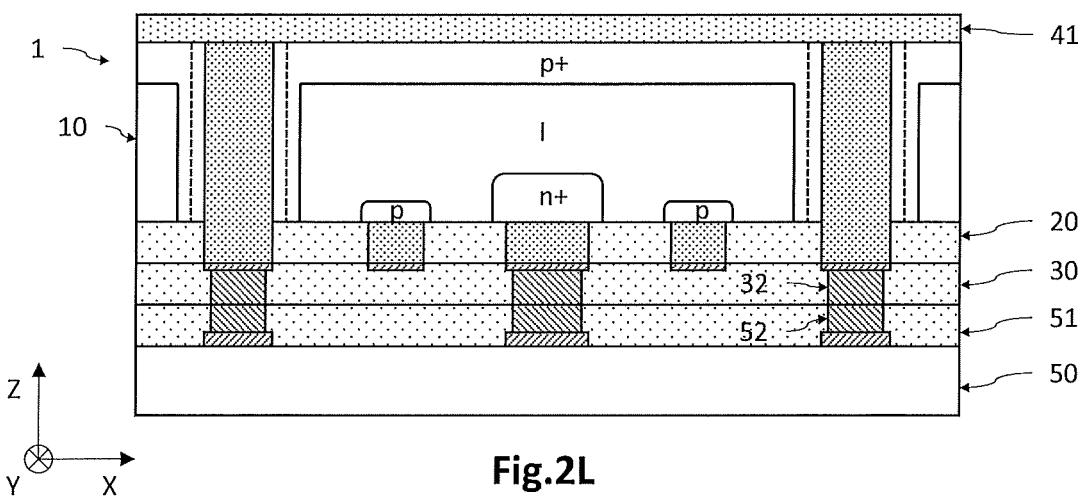

In the figures and in the remainder of the description, the same references represent identical or similar elements. In addition, the various elements are not shown to scale so as to improve the clarity of the figures. Moreover, the various embodiments and variants are not mutually exclusive and may be combined with one another. Unless indicated otherwise, the terms "substantially", "around", "of" the order of mean to within 10%, and preferably to within 5%.

The invention generally relates to a method for manufacturing at least one passivated planar photodiode, and preferably an array of photodiodes. Each photodiode is preferably based on germanium and is designed to detect light radiation in the near infrared (SWIR, for Short Wavelength IR) corresponding to the spectral range from 0.8 µm to around 1.7 µm, or even to around 2.5 µm.

The photodiodes are said to be planar insofar as they extend in one and the same main plane, between first and second faces that are parallel to and opposite one another. They each have what is called a semiconductor detection portion, within which there is a PN or PIN junction having a substantially constant thickness between the first and second faces. Each photodiode has a first region doped with a first conductivity type, for example n-type, flush with the first face and forming a doped well (also called doped box), a second region doped with a second conductivity type, for example p-type, flush with the second face, and an intermediate region situated between the two doped regions and surrounding the first doped region in the main plane. This intermediate region may be doped with the second conductivity type, for example p-type, so as to form a PN junction, or be intrinsic, that is to say not intentionally doped, so as to form a PIN junction. The planar photodiodes then do not have a mesa structure, and are optically isolated from one another, either by trenches advantageously filled with a doped semiconductor material or by a sufficient distance separating the photodiodes from one another. Moreover, the photodiode is said to be passivated insofar as the first face is covered, here in part, by a passivation layer made from a dielectric material. The passivation layer is intended in particular to reduce the surface component of the dark current of each photodiode.

In general, the dark current of a photodiode is the electric current present within the photodiode during operation, when it is not subjected to light radiation. It may be formed of thermally generated currents within the volume of the semiconductor detection portion (diffusion currents, depletion currents, tunnel currents, etc.) and of surface currents. The surface currents may be linked to the presence of electrical charges in the passivation layer. Specifically, these electrical charges may induce a modification of the curvature of the energy bands close to the surface, leading to the formation of a depleted zone or of an inversion zone. The depleted zone, when it is situated in the space charge zone of the photodiode, may give rise to stray generation-recombination currents. Moreover, the inversion zone, which is then electrically conductive, may allow electrical charges to move between n-doped and p-doped biased regions situated at the interface with the passivation layer.

The manufacturing method thus makes it possible to obtain one or more passivated planar photodiodes having, for each photodiode, at least one peripheral region of the semiconductor detection portion, doped with the second conductivity type (for example p-type), flush with the first face and surrounding the first doped region in the main plane. This peripheral region makes it possible in particular to limit or to avoid the formation of a depleted zone or of an inversion zone and therefore makes it possible to limit stray surface currents associated with the curvature of the energy bands.

Moreover, if the photodiodes are optically isolated from one another by trenches filled with a doped semiconductor material, and are reverse-biased from the first face, the peripheral region furthermore makes it possible to limit or to avoid the formation of the stray surface current associated with the movement of the electrical charges (electrical short-circuit) at the interface with the passivation layer between the first doped region and the doped semiconductor trenches.

The manufacturing method thus makes it possible to obtain one or more photodiodes with a reduced dark current. As is described below, the peripheral region is obtained without causing a significant change in the characteristics of the semiconductor detection portion, and more precisely without inducing a change in the dimensions of the first doped region.

For the sake of clarity, a passivated planar photodiode obtained by the manufacturing method according to one embodiment will first of all be illustrated.

FIG. 1A is a partial and schematic cross-sectional view of such a passivated planar photodiode 1 belonging to an array of photodiodes. In this example, the photodiodes 1 are based on germanium. They are reverse-biased from the first face 10a and are optically isolated from one another by trenches filled with a doped semiconductor material.

A three-dimensional direct reference frame (X, Y, Z) is defined here and for the remainder of the description, in which the X and Y axes form a plane parallel to the main plane of the photodiodes 1, and in which the Z axis is oriented along the thickness of the semiconductor detection portion 10 of the photodiode 1, from the second face 10b in the direction of the first face 10a.

The photodiode 1 has a semiconductor detection portion 10 extending along the Z axis between a first and a second face 10a, 10b that are parallel to and opposite one another. The first and second faces 10a, 10b are common to each photodiode 1 of the array. They may be substantially planar, such that the semiconductor detection portion 10 has a substantially constant thickness along the Z axis, for example of between a few hundred nanometres and a few microns, for example of between around 1 μm and around 5 μm. The thickness is chosen so as to obtain good absorption in the wavelength range of the light radiation to be detected. The semiconductor detection portion 10 has a transverse dimension in the XY plane that may be between a few hundred nanometres and a few tens of microns, for example between around 1 μm and around 20 μm.

The semiconductor detection portion 10 is made from at least one crystalline, preferably monocrystalline, semiconductor material. It is moreover based on a chemical element of interest, here based on germanium. Based on is understood to mean that the crystalline semiconductor material corresponds to the chemical element of interest or is an alloy formed of at least the chemical element of interest. The chemical element of interest is advantageously germanium, such that the photodiodes 1 are made from germanium Ge, silicon-germanium SiGe, germanium-tin GeSn, and silicon-germanium-tin SiGeSn. In this example, the semiconductor detection portion 10 is derived from at least one layer made from the same chemical element of interest, namely in this case from germanium. It may thus be a layer or a substrate made from the same semiconductor material and have regions of different conductivity types (homojunction) so as to form a PN or PIN junction. As a variant, it may be a stack of sublayers of various semiconductor materials (heterojunction), which are then formed based on the chemical element of interest.

The semiconductor detection portion 10 is thus formed of a first region 11 doped with a first conductivity type, here n-type, which is flush with the first face 10a and forms an n-doped well, and a second region 12 doped with a second conductivity type, here p-type, which is flush with the second face 10b. Flush is understood to mean "reach the level of", or "extends from". An intrinsic intermediate region 13 (in the case of a PIN junction) or one doped with the second conductivity type (in the case of a PN junction) is situated between and in contact with the two doped regions 11, 12, and surrounds the first n-doped region 11 in the main plane. In this example, the semiconductor junction is of PIN type, the first region 11 being n+-doped, the second region 12 being p+-doped and the intermediate region 13 is intrinsic (not intentionally doped).

The first n+-doped region 11 extends in this case from the first face 10a and is surrounded by the intermediate region 13 in the main plane. It is spaced from the lateral edge 10c of the semiconductor detection portion 10 in the XY plane, the lateral edge 10c connecting the first and second faces 10a, 10b to one another. It thus forms an n-doped well that is flush with the first face 10a and is spaced by a non-zero distance with respect to the lateral edge 10c as well as the second face 10b. The first n-doped region 11 thus contributes to delimiting the first face 10a. It may exhibit doping that may be between around $10^{19}$ and $10^{21}$ at/cm$^3$.

The second region 12, which is p+-doped here, extends in the XY plane flush with the second face 10b, here from the lateral edge 10c. It extends along the Z axis from the second face 10b. It may have a substantially homogeneous thickness along the Z axis and thus be flush only with a lower zone of the lateral edge 10c. As a variant, as illustrated in FIGS. 1A and 1B, the second p+-doped region 12 may have a p+-doped lateral region 15 that is continuously flush with the lateral edge 10c along the Z axis and extends over the entire periphery of the semiconductor detection portion 10. The second p+-doped region 12 may exhibit doping that may be between around $10^{18}$ and $10^{20}$ at/cm$^3$.

The intermediate region 13 is situated between the two n+-doped and p+-doped regions 11, 12. It therefore surrounds the first n+-doped region 11 in the XY plane and may be locally flush with the first face 10a. It is intrinsic here, so as to form a PIN junction, but may be doped with the second conductivity type, for example p-type, in order to form a PN junction (cf. FIG. 1B).

The optoelectronic device here has a lower insulating layer 41, made from a dielectric material, covering the second face 10b of the semiconductor detection portion 10 and, as described below, the lower face of a trench filled with a doped semiconductor material. The doped semiconductor trench contributes to electrically biasing the photodiode 1, here from the first face 10a, and to pixelating the array of photodiodes (optical isolation). The lower insulating layer 41 may furthermore be designed to form an anti-reflection function with regard to the incident light radiation. Specifically, it forms the reception face for the light radiation intended to be detected.

The semiconductor detection portion 10 of the photodiode 1 is here delimited laterally, in the XY plane, by a preferably continuous trench, filled with a semiconductor material doped with the second conductivity type, and here forming a p+-doped semiconductor lateral portion 23. The trench extends here over the entire thickness of the semiconductor detection portion 10 so as to open onto the lower insulating layer 41. The p+-doped lateral portion 23 is then in contact with the lateral edge 10c of the semiconductor detection portion 10. As a variant, the trench may not open onto the lower insulating layer 41 and may end in the second p+-doped region 12. The semiconductor material is preferably based on silicon, for example amorphous silicon, polycrystalline silicon, silicon-germanium, or may even be made from amorphous germanium.

The passivation layer 20 covers the first face 10a of the semiconductor detection portion 10. It may thus be in contact with the intermediate region 13 when this is flush with the first face 10a, and may be in contact with the first n+-doped region 11. It is made from a dielectric material, such as a silicon oxide, a silicon nitride, or a silicon oxynitride. Other dielectric materials may be used, such as a hafnium oxide or aluminium oxide, or even an aluminium nitride, inter alia. It has a thickness of for example between 50 nm and 500 nm.

The purpose of the passivation layer 20 is in particular to reduce the dark current at the surface of the semiconductor detection portion 10. However, it appears that the passivation deposition technique that is used may contribute to generating a surface contribution of the dark current. Specifically, as indicated by the article by Sood et al. 2011 mentioned above, the passivation layer 20 may lead to the formation of a depleted zone in the intermediate region 13 starting from the first face 10a. When this depleted zone is situated in the space charge zone of the photodiode 1, it may then be the location of a stray generation-recombination current. Moreover, the passivation layer 20 may form an inversion zone that is then electrically conductive, which may therefore connect the first n+-doped region 11 to the p+-doped lateral portion 23.

Therefore, each photodiode 1 has a peripheral region 14 doped with the second conductivity type, here p-type, flush with the first face 10a and surrounding the first n+-doped region 11 in the XY plane. Surround is understood to mean that the p-doped peripheral region 14 extends around the first n+-doped region 11 in the main plane, continuously or possibly discontinuously. The peripheral region 14 thus extends along the Z axis from the first face 10a, and extends in the XY plane at least partly around the first n+-doped region 11. It is situated at a non-zero distance from the first n+-doped region 11 or, as a variant, may come into contact therewith. It is also situated at a non-zero distance from the p+-doped lateral portion 23 or, as a variant, may come into contact therewith. The p-doped peripheral region 14 may have a doping level of the order of $10^{16}$ to $10^{18}$ at/cm$^3$, greater than that of the intermediate region 13 when it is p-doped. The p-type doping elements may be chosen from boron and gallium, inter alia. As described in detail below, the p-doped peripheral region 14 is formed during annealing, ensuring the diffusion of the doping elements from the p-doped peripheral portion 21, situated in contact with the first face 10a and extending through through-apertures of the passivation layer 20, to the semiconductor detection portion 10.

The presence of the p-doped peripheral region 14 in the intermediate region 13, at the first face 10a and extending at least partly around the first n+-doped region 11 in the XY plane, thus makes it possible to avoid the presence of a depleted zone or of an inversion zone at the first face 10a. It furthermore makes it possible to avoid the space charge zone of the photodiode 1 "pinching" or extending excessively at the first face 10a. A "pinched" space charge zone, that is to say one that is reduced at the first face 10a, may promote tunnel currents. An excessively extended space charge zone may promote generation-recombination current. Thus, the formation of a stray generation-recombination current or tunnel current at the first face 10a is avoided, and the formation of a stray current between the first n+-doped region 11 and the p+-doped lateral portion 23 is also avoided. The surface components of the dark current are thus reduced, thereby making it possible to improve the performance of the array of photodiodes.

Moreover, the semiconductor detection portion 10 advantageously has a lateral region 15 doped with the second conductivity type, here p+-type, situated at the lateral edge 10c. This lateral region 15 has a doping level higher than that of the intermediate region 13 when it is doped. The p+-doped lateral region 15 is flush with the lateral edge 10c and is in contact with the p+-doped lateral portion 23. The biasing of the second p+-doped region 12 is thus improved in that the contact surface with the p+-doped lateral portion 23 is increased. In addition, this p+-doped lateral region 15 makes it possible to avoid the space charge zone of the photodiode 1 extending to the lateral edge 10c. The contribution of this zone (which is potentially not free of defects linked to the production of the trenches) to the dark current is thus limited. The performance of the photodiode 1 is thus improved.

Moreover, the semiconductor detection portion 10 is based on germanium, for example made from germanium, and the p+-doped lateral portion 23 is based on silicon, for example made from doped polycrystalline silicon. The semiconductor detection portion 10 then advantageously has a lateral zone 16 based on silicon-germanium, which may be formed during the diffusion annealing used to produce the p-doped peripheral region 14. The lateral zone 16 is flush with the lateral edge 10c and is in contact with the p+-doped lateral portion 23. The lateral zone 16 thus has a band gap energy greater than that of the semiconductor detection portion 10 made from germanium. This lateral "gap opening" makes it possible to reduce the sensitivity of the photodiode 1 to defects present near the trenches. The performance of the photodiode 1 is thus also improved.

The photodiode 1 furthermore has an electrical circuit for reverse-biasing each photodiode 1. In this example, the electrical circuit makes it possible to bias the photodiode 1 from the first face 10a. As described below, the electrical circuit may have contact metallizations extending through through-apertures of the passivation layer 20 and coming into contact with the first n+-doped region 11, on the one hand, and with the p+-doped lateral portion 23, on the other hand.

In this respect, FIG. 1B is a partial and schematic cross-sectional view of a passivated planar photodiode 1 belonging to an array of photodiodes and obtained by way of the manufacturing method according to another embodiment. The photodiodes 1 are distinguished here from those described with reference to FIG. 1A essentially in that the semiconductor junction is of PN type. The intermediate region 13 is then p-doped here and the second region is p+-doped.

A central portion 25, made from an n-doped semiconductor material, is situated here facing, that is to say perpendicular to, the first n+-doped region 11 and contributes to ensuring the biasing thereof. As described in detail below, this central portion 25 is used to produce the first n+-doped region 11 in the semiconductor detection portion 10. Specifically, the first n+-doped region 11 is formed by a diffusion of the n-type doping elements, for example phosphorus, arsenic, antimony, contained in the central portion 25. This makes it possible to avoid forming the first n+-doped region 11 by ion-implanting n-type doping elements (phosphorus for example) directly into the semiconductor detection portion 10. The formation of defects that may stem from the ion implantation into the germanium of the semiconductor detection portion 10 is thus avoided. The performance of the photodiode 1 is thus also improved.

An upper insulating layer 30 covers the passivation layer 20. It makes it possible to ensure mechanical assembly and electrical connection of the array of photodiodes to a control chip (not shown). The upper insulating layer 30 is made from a dielectric material, for example a silicon oxide or a silicon nitride, or even an aluminium oxide or hafnium oxide, inter alia. It has through-apertures situated facing the first n+-doped region 11 and the p+-doped lateral portion 23. They are each filled with a contact metallization 32, which comes into contact here with a thin reflective and conductive portion 31, here made from a nickel silicide, having a low electrical resistivity and also acting as a reflector with respect to the incident light radiation coming from the second face 10b (the latter performing the role of an optical reception face). The absorbed proportion of the incident light radiation in the semiconductor detection portion is thus improved. The contact metallizations 32 are in electrical contact with the lateral portion 23 and with the upper region 11 (here via the central portion 25) so as to reverse-bias the photodiode.

One example of a method for manufacturing an array of photodiodes according to one variant of the embodiment illustrated in FIG. 1B is now described with reference to FIGS. 2A to 2L. In this example, the photodiodes 1 are made from germanium and have a PIN junction, and are designed to detect infrared radiation in the SWIR range. The photodiodes 1 are planar and passivated, and are reverse-biased from the first face 10a.

In a first step (FIG. 2A), a first monocrystalline germanium semiconductor sublayer 42.1 is produced. The first semiconductor sublayer 42.1 is attached to a support layer 40, here made from silicon, by way of a lower insulating layer 41, here made from a silicon oxide. This stack takes the form of a GeOI substrate (for Germanium On Insulator). This stack is preferably produced by way of the method described in the publication by Reboud et al. *Structural and optical properties of* 200*mm germanium-on-insulator (GeOI) substrates for silicon photonics applications*, Proc. SPIE 9367, Silicon Photonics X, 936714 (Feb. 27, 2015). Such a method has the advantage of producing a germanium semiconductor sublayer 42.1 having a complete absence or a low level of structural defects such as dislocations. The germanium may be not intentionally doped or be doped, for example p-doped. The semiconductor sublayer 42.1 may have a thickness of between 20 nm and around 500 nm, for example equal to around 300 nm, and may be covered with a protective layer (not shown) made from a silicon oxide. The lower insulating layer 41 (BOX, for Buried Oxide) may have a thickness of between 50 nm and 1 μm and advantageously provides an anti-reflection function.

The first sublayer 42.1 made from germanium is then doped with the second conductivity type, here p-type, by ion implantation of a dopant such as boron or gallium, when the first sublayer 42.1 was initially made from intrinsic germanium. The protective layer, where applicable, has been removed beforehand by surface cleaning, and the first germanium sublayer 42.1 may be coated with a pre-implantation oxide layer (not shown) of a thickness of a few tens of nanometres, for example equal to 20 nm. The germanium sublayer 42.1 then has a doping level of between around $10^{18}$ and $10^{20}$ at/cm$^3$. The dopant may then be diffusion-annealed under nitrogen for a few minutes to a few hours, for example 1 h, at a temperature that may be between 600° C. and 800° C., for example equal to 800° C. This annealing may not be performed when the sublayer 42.1 was doped while growing.

In a following step (FIG. 2B), a second germanium semiconductor sublayer 42.2 is produced epitaxially from the first sublayer 42.1. The two sublayers 42.1, 42.2 are intended to form the coplanar germanium semiconductor detection portions 10 of the array of photodiodes. The second sublayer 42.2 is formed epitaxially, for example by chemical vapour deposition (CVD) or by any other epitaxial growth technique. Annealing operations may be performed in order to reduce the dislocation rate in the sublayer 42.2. The pre-implementation oxide layer, where applicable, has been removed beforehand by surface cleaning. The second germanium sublayer 42.2 is intrinsic here, that is to say not intentionally doped. It is intended to form the light absorption zone of the photodiodes 1. Its thickness depends on the wavelength range of the light radiation to be detected in the case of a photodiode 1. In the context of SWIR photodiodes, the intrinsic germanium sublayer 42.2 has a thickness for example of between 0.5 µm and 3 µm, preferably equal to 1.5 µm.

In a following step (FIG. 2C), the passivation layer 20 is deposited so as to continuously cover the upper face of the second sublayer 42.2, that is to say so as to cover the semiconductor detection portions of the photodiodes. The passivation layer 20 is made from a dielectric material, for example a silicon oxide, a silicon nitride or a silicon oxynitride. The upper face of the second sublayer 42.2 may have been cleaned. The passivation layer 20 may have a thickness of between 10 nm and 600 nm.

In a following step (FIG. 2D), the through-apertures 22 are produced within the passivation layer 20 by photolithography and etching. The through-apertures 22 thus open onto the upper face 10a of the semiconductor detection portion 10. They are situated facing the zones likely to exhibit an inversion phenomenon (depleted zone or inversion zone), and surround a central part of the semiconductor detection portion 10 in which the first n+-doped region 11 is intended to be formed. For each photodiode, the through-aperture 22 continuously surrounds the central part. These through-apertures 22 may have different patterns in the XY plane, for example a circular or square pattern. The width of the through-apertures 22 depends on the pitch of the sensitive pixels of the array of photodiodes, and may be for example between 1 µm and 100 µm.

It is also possible at the same time to produce through-apertures 26 that are each situated facing the central part of the photodiodes. The width, for example the diameter in the case of a circular through-aperture 26, depends in particular on the desired width of the first n+-doped region 11. It may be between 0.3 µm and 5 µm.

In a following step (FIG. 2E), the trenches 24 that are intended to pixelate the photodiodes 1 and to contribute to electrically reverse-biasing them are then produced by photolithography and etching. Localized etching of the passivation layer 20, of the intrinsic germanium sublayer 42.2 and of the p+-doped germanium sublayer 42.1 is thus performed until they open onto the upper face of the lower insulating layer 41. Each trench 24 thus preferably extends continuously around a photodiode. A plurality of semiconductor detection portions 10 that are separated from one another by a continuous trench 24 are thus obtained. They are preferably obtained using an anisotropic etching technique, so as to obtain a lateral edge 10c that is substantially vertical along the Z axis. The trenches 24 have a transverse dimension (width) in the XY plane that may be between 300 nm and 2 µm, for example equal to 1 µm. The semiconductor detection portions 10 may thus have for example a circular, oval, polygonal, for example square, shape in the XY plane, or any other shape.

In a following step (FIG. 2F), the peripheral portions 21, and advantageously at the same time the lateral portions 23 and the central portion 25, are then produced. For this purpose, a doped semiconductor material is deposited so as to fill the trenches 24 and the through-apertures 22, 26. The semiconductor material is preferably a material based on silicon, for example amorphous silicon, polycrystalline silicon, silicon-germanium or even amorphous germanium. The semiconductor material is doped with the second conductivity type, here p-type boron or gallium. Thus, one and the same doped semiconductor material, advantageously based on germanium, fills the trenches 24 and forms the lateral portion 23, and also forms the peripheral portion 21 and the central portion 25. It thus comes into contact with the lateral edge 10c via the trenches, into contact with the upper face 10a of the semiconductor detection portion 10 via the peripheral through-apertures 22, on the one hand, and via the central through-aperture 26, on the other hand. A chemical-mechanical polishing (CMP) step is then performed, with stopping on the upper face of the passivation layer 20, in order to eliminate the excess semiconductor material and planarize the upper face formed by the passivation layer 20 and the semiconductor material. A p-doped lateral portion 23 is thus obtained in the trenches, a p-doped peripheral portion 21 in this case surrounding a p-doped central portion 25.

In a following step (FIG. 2G), ion implantation of p-type doping elements into the lateral portion 23, for example boron, is performed so as to obtain a p+-doped lateral portion 23 over the entire thickness thereof, with a doping level of for example between $10^{19}$ and $10^{21}$ at/cm$^3$. The ion implantation is performed in a localized manner through a through-aperture formed in a photosensitive resin 43. The photosensitive resin 43 is then removed.

In a following step (FIG. 2H), the peripheral regions 14 doped with the second conductivity type, here p-type, surrounding a central part intended to receive the first n+-doped region 11, are produced. For this purpose, diffusion annealing is performed, for example at a temperature of between 700° C. and 800° C., for a duration of for example between 10 min and 5 h, so as to ensure the diffusion of the doping elements, in this case boron, that are present in the peripheral portions 21 to the intermediate region 13 through the first face 10a. At the same time, the p+-doped lateral regions 15 are also formed by diffusion of the doping elements from the p+-doped lateral portions 23 to the intermediate region 13. Moreover, at the same time, the lateral zone 16 with a gap opening is formed by interdiffusion between the germanium of the semiconductor detection portion 10 and the silicon of the lateral portion 23.

In a following step (FIGS. 2I and 2J), the first region bb doped with the first conductivity type, here n+-type, is then produced. For this purpose, an ion implantation zone for n-type dopants, for example phosphorus or arsenic, or antimony, is defined by way of a through-aperture in a photosensitive resin 44. The through-aperture is situated facing the central part of the photodiode 1 and has dimensions in the XY plane corresponding to the desired dimensions of the first doped region 11. They may be for example between 300 nm and 90 µm. The first n+-doped portion 11 is produced in two stages: firstly, ion implantation of a dopant such as phosphorus is performed through the aperture in the resin 44, into the initially p-doped central portion 25 so as to make it n+-doped. The photosensitive resin 44 may then be removed. At least one annealing operation ensuring the diffusion of the n-type doping elements from the n+-doped central portion 25 to the semiconductor detection portion 10 is then performed, for example at a first temperature of 800° C. for 5 min and then at a second temperature of between 600° C. and 700° C. for 10 s to 60 s. By virtue of this two-stage step, defects linked to the ion implantation of n-type doping elements directly into the semiconductor detection portion 10 are thus limited.

The first n-doped regions 11 thus form doped wells defined in the XY plane and following the −Z direction by the intrinsic germanium intermediate region 13. They are preferably n+-overdoped, and may thus have a doping level of between around $10^{19}$ and $10^{21}$ at/cm$^3$. This new diffusion annealing causes additional diffusion of the p-type dopant (boron) forming the peripheral portion 14 within the germanium. However, as the diffusion of the boron is less than that of the phosphorus, the dimensions of the p-doped peripheral region 14 and of the p+-doped lateral region 15 are not substantially changed or are barely changed. A first n+-doped region 11 is thus obtained within the semiconductor detection portion 10, delimited by the intermediate region 13 made from intrinsic germanium, and surrounded in the XY plane by the p-doped peripheral region 14 situated at the first face 10*a*.

In a following step (FIG. 2K), the thin reflective portions 31, made from an electrically conductive and reflective material for the incident light radiation, are then advantageously produced. This material is preferably a silicide of a transition metal, for example a nickel silicide NiSi$_2$. For this purpose, a continuous thin layer of nickel Ni of a thickness of for example 9 nm is deposited so as to continuously cover the upper face of the passivation layer 20 and p-doped portions based on silicon, followed by a continuous thin layer of titanium nitride TiN of a thickness of for example 10 nm. Silicidation annealing is then performed, for example from 300° C. to 400° C. for a duration of a few tens of seconds, in order to form localized zones 31 of NiSi$_2$ in contact with the lateral portions 23, peripheral portions 21 and central portion 25. A wet etching step makes it possible to remove the zones that have not silicided. Thin conductive and reflective portions 31 of NiSi$_2$ are thus obtained.

An upper insulating layer 30 is then deposited so as to cover the passivation layer 20 as well as the thin reflective portions 31. The upper insulating layer 30 is made from a dielectric material, for example a silicon oxide, silicon nitride or silicon oxynitride, an aluminium oxide or aluminium nitride, a hafnium oxide, inter alia. The upper insulating layer 30 may have a thickness of for example between 10 nm and 500 nm.

Finally, contact metallizations 32 are produced, extending through the upper insulating layer 30 and coming into contact with the thin reflective portions 31 situated facing the lateral portions 23 and the central portion 25. In this case, the peripheral portions 21 are not intended to be biased but, as a variant, they may be biased so as to modify the space charge zone to a greater or lesser extent. The contact metallizations 32 may be produced conventionally by filling the through-apertures through the upper insulating layer 30 with at least one metal material (Ti-based barrier layer, copper core), followed by a CMP planarization step.

In a following step (FIG. 2L), the optoelectronic stack thus obtained is hybridized on a control chip 50. The connection face of the control chip 50 may thus be coated with an insulating layer 51, made from a dielectric material, through which contact metallizations 52 pass. The optoelectronic stack and the control chip 50 are thus assembled by hybrid molecular adhesion, though contact between the faces formed by the contact metallizations 32, 52 and the insulating layers 30, 51. Bonding annealing may be performed so as to increase the surface bonding energy between the two faces in contact.

The support layer 40 is then removed, for example by abrasion (grinding), so as to expose the lower insulating layer 41. This thus forms the reception face for the light radiation to be detected, and advantageously provides an anti-reflection function.

The manufacturing method thus makes it possible to obtain one or more planar and passivated photodiodes 1 whose peripheral regions 14 surrounding the first doped regions 11 make it possible to limit the surface components of the dark current that may be linked to the passivation layer 20.

In addition, insofar as the peripheral regions 14 are formed by diffusion of dopants from the peripheral portions 21 made from a doped semiconductor material, this being the case before the formation, by ion implantation, of the first doped regions 11, the manufacturing method makes it possible to preserve the dimensions of the latter. Any risk of short-circuiting of the photodiodes 1 by excessively modifying the dimensions of the first doped regions 11 is thus eliminated.

Moreover, the performance of the photodiodes 1 is also improved in particular by the following features: the lateral gap opening zone 16 situated at the lateral edge 10*c*, the p-doped lateral regions 15 situated at the lateral edge 10*c*, the thin reflective portions 31, the first doped regions 11 obtained by dopant diffusion and not by ion implantation directly into the semiconductor detection portion 10. Moreover, the manufacturing method is simplified when the lateral portions 23, peripheral portions 21 and central portion 25 are produced at the same time and made from one and the same doped semiconductor material.

Particular embodiments have just been described. Various modifications and variants will be apparent to a person skilled in the art.

Figure 3A:
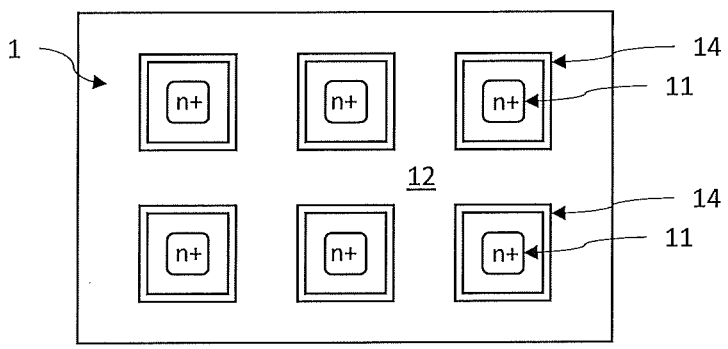
FIGS. 3A and 3B are schematic and partial plan views of an array of photodiodes according to two variant embodiments.
Figure 3B:
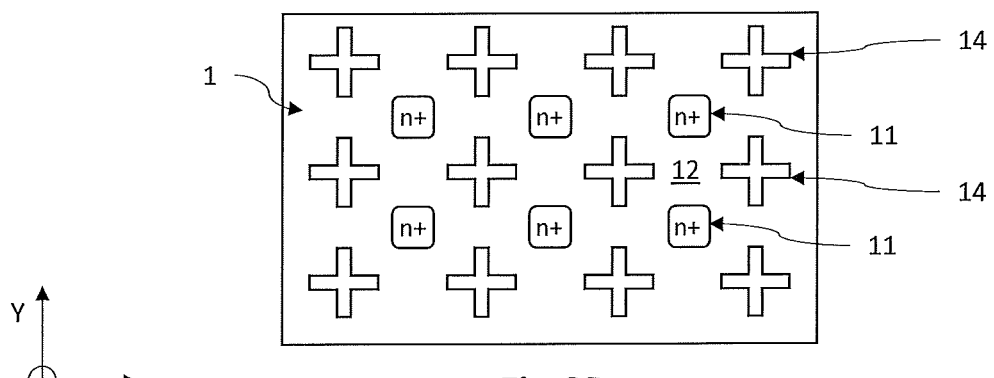

Thus, as illustrated in FIGS. 3A and 3B in plan view, each of the peripheral regions 14 may extend around the corresponding first doped region 11 continuously (FIG. 3A) or discontinuously (FIG. 3B). In the latter case, the peripheral portions 14 may have various patterns in the XY plane, for example cross-shaped patterns as shown here, or any other suitable pattern.

Figure 3C:
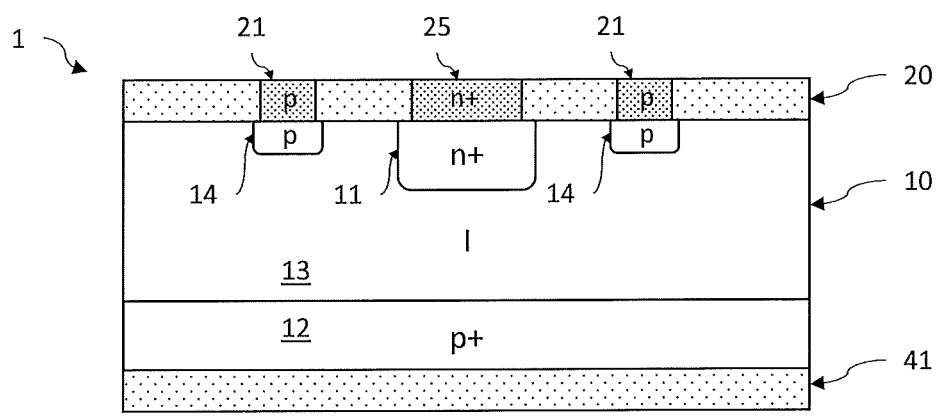
FIG. 3C is a sectional, schematic and partial view of a passivated planar photodiode according to another embodiment.

Moreover, as illustrated schematically in FIG. 3C in a sectional view, the manufacturing method also makes it possible to obtain an array of passivated planar photodiodes 1 that are optically isolated from one another by a sufficient distance in the XY plane. The photodiodes 1 are then not pixelated by trenches surrounding them. The first n+-doped regions 11 are biased from the first face 10*a* via contact metallizations (not shown), and the second p+-doped region 12 may be biased by a contact metallization situated at the first face 10*a* and connected thereto by a conductive trench, or situated at the second face 10*b*.

The invention claimed is:

1. A method for manufacturing at least one passivated planar photodiode, comprising:
   producing a semiconductor detection portion, having a first face and a second face that are opposite one another and parallel to a main plane of the at least one passivated planar photodiode, the semiconductor detection portion having
      an intermediate region flush with the first face, and
      a lower region doped with a second conductivity type and flush with the second face,
   depositing a passivation layer, made from a dielectric material, covering the first face, and forming, in the passivation layer, at least one through-aperture opening onto the first face, the at least one through-aperture at least partially surrounding a central part of the semiconductor detection portion in the main plane;
   producing a lateral portion made from a semiconductor material doped with the second conductivity type and configured to be electrically biased, in contact with the lower region;
   producing at least one peripheral portion, made from the semiconductor material containing doping elements with the second conductivity type, and in contact with the first face through the at least one through-aperture;

annealing, causing diffusion of the doping elements from the at least one peripheral portion to the semiconductor detection portion, thereby forming, in the semiconductor detection portion, a peripheral region doped with the second conductivity type, flush with the first face and surrounding the central part in the main plane, the peripheral region situated between an upper region and the lateral portion and located at a non-zero distance from the upper region and the lateral portion in a direction parallel to the main plane;

producing, in the central part of the semiconductor detection portion, the upper region doped with a first conductivity type opposite the second conductivity type, the upper region configured to be electrically biased, flush with the first face, separated from the lower region by the intermediate region, and surrounded in the main plane by the peripheral region.

2. The method according to claim 1, the annealing causing diffusion of the doping elements with the second conductivity type from the lateral portion to the semiconductor detection portion, thereby forming a lateral region doped with the second conductivity type in the semiconductor detection portion.

3. The method according to claim 1, wherein the semiconductor detection portion includes germanium, and the lateral portion include silicon, the annealing causing diffusion of the silicon from the lateral portion to the semiconductor detection portion, thereby forming a lateral zone including silicon-germanium in the semiconductor detection portion.

4. The method according to claim 1, further comprising:
producing a stack made from a semiconductor material of interest, formed of a lower sublayer doped with the second conductivity type and of an intermediate sublayer;
producing a trench extending through the stack of the lower sublayer and the intermediate sublayer, thereby defining the semiconductor detection portion of the at least one passivated planar photodiode;
simultaneously producing the lateral portion and the at least one peripheral portion by depositing the semiconductor material doped with the second conductivity type in the through-aperture of the passivation layer and in the trench.

5. The method according to claim 1, further comprising producing at least one reflective portion, situated in contact with the at least one peripheral portion on a face opposite the semiconductor detection portion, the at least one reflective portion made from a material that is reflective with respect to incident light radiation detected by the at least one passivated planar photodiode.

6. The method according to claim 5, wherein the at least one reflective portion is obtained by depositing a layer made from a metal material on the at least one peripheral portion, the at least one reflective portion including silicon, the depositing followed by silicidation annealing, thereby forming the at least one reflective portion made from the silicided metal material.

7. The method according to claim 1, wherein the producing the doped upper region comprises:
producing a central portion made from a semiconductor material doped with the first conductivity type, arranged in a central through-aperture of the passivation layer situated in the central part, the central portion being in contact with the first face;

annealing, causing diffusion of doping elements with the first conductivity type from the central portion to the semiconductor detection portion, thereby forming the upper region.

8. The method according to claim 7, wherein the producing the central portion comprises:
depositing the semiconductor material doped with the second conductivity type in the central through-aperture;
ion-implanting doping elements with the first conductivity type in the central portion.

9. A passivated planar photodiode, having:
a semiconductor detection portion, having a first face and a second face that are opposite one another and parallel to a main plane of the passivated planar photodiode, the semiconductor detection portion having:
an upper region doped with a first conductivity type and flush with the first face,
a lower region doped with a second conductivity type opposite the first conductivity type, and flush with the second face,
an intermediate region situated between the upper region and the lower region and surrounding the upper region in the main plane,
a passivation layer covering the first face, having through-apertures each filled with a peripheral portion, made from a semiconductor material containing doping elements with the second conductivity type, the peripheral portion being in contact with the first face through the through-apertures;
a lateral portion made from the semiconductor material doped with the second conductivity type and configured to be electrically biased, in contact with the lower region; wherein the semiconductor detection portion includes
a peripheral region, doped with the second conductivity type, flush with the first face and surrounding the upper region in the main plane, the peripheral region situated between the upper region and the lateral portion and located at a non-zero distance from the upper region and the lateral portion in a direction parallel to the main plane.

10. The photodiode according to claim 9, having a central portion, made from a semiconductor material doped with the first conductivity type, situated in contact with the upper region through one of the through-apertures of the passivation layer.

11. The photodiode according to claim 10, wherein the peripheral portion and the central portion are coated with a reflective portion made from a silicided metal material.

12. The photodiode according to claim 9, wherein the lateral portion, doped with the second conductivity type, is in contact with and surrounding the semiconductor detection portion in the main plane, and wherein the semiconductor detection portion has a lateral region doped with the second conductivity type and in contact with the lateral portion.

13. The photodiode according to claim 9, wherein the semiconductor detection portion includes germanium and the lateral portion includes silicon, the semiconductor detection portion having a lateral zone including silicon-germanium in contact with the lateral portion.

14. An optoelectronic device having an array of photodiodes, each of the photodiodes being the photodiode according to claim 9, wherein the photodiodes are coplanar in the main plane.

* * * * *